United States Patent
Chung et al.

(10) Patent No.: US 9,461,647 B2
(45) Date of Patent: Oct. 4, 2016

(54) SEMICONDUCTOR DEVICE

(71) Applicant: SK hynix Inc., Icheon-si Gyeonggi-do (KR)

(72) Inventors: Won Kyung Chung, Icheon-si (KR); Saeng Hwan Kim, Suwon-si (KR)

(73) Assignee: SK HYNIX INC., Icheon-Si (KR)

(*) Notice: Subject to any disclaimer, the term of this patent is extended or adjusted under 35 U.S.C. 154(b) by 0 days.

(21) Appl. No.: 14/638,572

(22) Filed: Mar. 4, 2015

(65) Prior Publication Data

US 2016/0164521 A1     Jun. 9, 2016

(30) Foreign Application Priority Data

Dec. 5, 2014  (KR) .................. 10-2014-0174068

(51) Int. Cl.
  *H03K 19/0175*  (2006.01)
  *G11C 11/4093*  (2006.01)

(52) U.S. Cl.
  CPC ... *H03K 19/017509* (2013.01); *G11C 11/4093* (2013.01); *H03K 19/017545* (2013.01)

(58) Field of Classification Search
  CPC .............. H03K 19/017509; H03K 19/017545; G11C 11/4093
  See application file for complete search history.

(56) References Cited

U.S. PATENT DOCUMENTS

| | | | |
|---|---|---|---|
| 7,995,966 B2 | 8/2011 | Sukegawa et al. | |
| 8,803,597 B2* | 8/2014 | Ko | H01L 25/03 327/565 |
| 2008/0037693 A1* | 2/2008 | Andrus | H04L 1/0057 375/359 |
| 2016/0012865 A1* | 1/2016 | Lee | H01L 25/0655 365/51 |

FOREIGN PATENT DOCUMENTS

KR   10-2014-0086188   * 7/2014   .............. G11C 5/02

* cited by examiner

*Primary Examiner* — Jason M Crawford
*Assistant Examiner* — Kurtis R Bahr
(74) *Attorney, Agent, or Firm* — William Park & Associates Ltd.

(57) ABSTRACT

A semiconductor device may include a first channel provided in a first die. The semiconductor device may include a second channel provided in a second die and disposed adjacent to the first channel, and configured to exchange signals and data with the first channel. The first channel and the second channel may receive and output calibration-related signals from and to each other through bonding, and may share calibration start signals. The calibration start signal may be respectively generated in the first channel and the second channel.

20 Claims, 7 Drawing Sheets

SEMICONDUCTOR DEVICE

CROSS-REFERENCES TO RELATED APPLICATION

The present application claims priority under 35 U.S.C. §119(a) to Korean application number 10-2014-0174068, filed on Dec. 5, 2014, in the Korean Intellectual Property Office, which is incorporated herein by reference in its entirety.

BACKGROUND

1. Technical Field

Various embodiments generally relate to a semiconductor device, and more particularly, to a technology for controlling ZQ calibration of a semiconductor device including two dies configured as a single chip.

2. Related Art

Developments are being made to increase the degree of integration and the operating speeds of semiconductor memory devices. Synchronous memory devices have been developed to increase the operating speeds of the semiconductor memory devices. These synchronous memory devices are capable of operating in synchronization with a clock signal received from outside a memory chip.

For example, an SDR (single data rate) synchronous memory device may be implemented whereby data is inputted and outputted through a single data pin during a single clock cycle. In the SDR synchronous memory device, the input and output of the data is in synchronization with the rising edge of a clock signal.

However, the SDR synchronous memory device has difficulty in operating with systems requiring high speed operations. Accordingly, a DDR (double data rate) synchronous memory device may be implemented whereby data is consecutively inputted and outputted through each data input/output pin, in synchronization with the rising edge and the falling edge of a clock signal.

As such, a bandwidth at least two times wider than the conventional SDR synchronous memory device may be realized without increasing the frequency of a clock signal, and thus, a high speed operation may be achieved.

A semiconductor device is being designed in a direction for consuming less power, and a data pattern information signal is used by being defined by a specification.

In particular, a memory for a high speed operation is being designed to be capable of receiving addresses at not only the rising edge but also the falling edge of an external clock. Since it is possible to receive addresses two times for one cycle, the number of address pins may be decreased when compared to a conventional semiconductor memory device. Also, an extra number of pins may be connected with a power supply voltage or a ground voltage to increase the operation speed of the semiconductor memory device.

In a semiconductor memory device such as a dynamic random access memory (DRAM), in order to achieve a larger capacity from a unit area, a plurality of semiconductor chips (or dies) are stacked and then packaged.

A semiconductor memory device packaged with only one semiconductor chip may be referred to as a single die package (SDP). Also, a semiconductor memory device stacked and packaged with two semiconductor chips may be referred to as a dual die package (DDP). Further, a semiconductor memory device stacked and packaged with four semiconductor chips may be referred to as a quad die package (QDP).

A low voltage semiconductor device (for example, an LPDDR4) is internally configured by 2 channels and is realized by mirroring two of the same chips in one die. In the case where only one channel is realized in one die for variety of business or actual maximization of a net die, two dies should be electrically coupled at a package level.

Originally, in 1 chip of a low voltage semiconductor device, only one ZQ pin exists for 2 channels.

SUMMARY

In an embodiment, a semiconductor device may include a first channel provided in a first die, and a second channel provided in a second die and disposed adjacent to the first channel, and may be configured to exchange signals and data with the first channel. The first channel and the second channel may receive and output calibration-related signals from and to each other through bonding, and may share calibration start signals respectively generated in the first channel and the second channel.

In an embodiment, a semiconductor device may include a plurality of channels formed in a single package, and may be configured to share calibration information through exchanging signals and data among respective dies. The semiconductor device may include ZQ driving blocks respectively provided in the plurality of channels, and may be configured to control calibrating operations of the respective channels. The semiconductor device may include ZQ control blocks configured to determine starting orders of the calibrating operations in the plurality of channels, and when the calibrating operations are ended in the respective channels.

DETAILED DESCRIPTION

Hereinafter, a semiconductor device will be described below with reference to the accompanying drawings through various examples of embodiments.

In the examples of configuring 2 channels by packaging 2 dies, considerations should be made for the ZQ pins.

Various embodiments may be directed to a technology for controlling the ZQ calibration timing of a multi-channel semiconductor device including two dies configured as a single chip.

According to various embodiments, it may be possible to independently control ZQ calibration in correspondence to PVT (process, voltage and temperature) in a multi-channel semiconductor device including two dies configured as a single chip.

Figure 1:
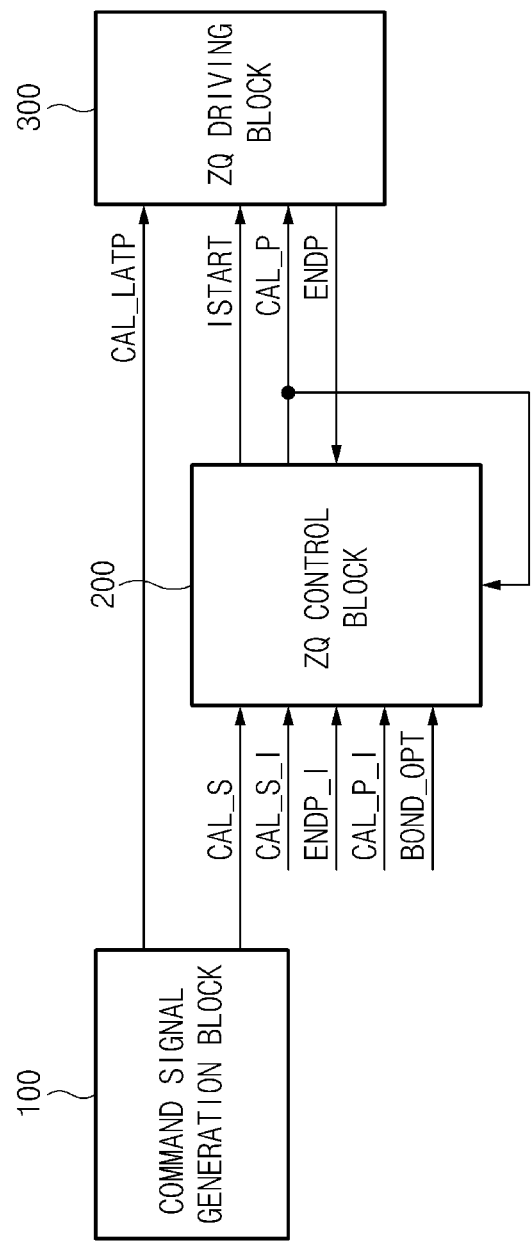
FIG. 1 is a configuration diagram illustrating a representation of an example of a semiconductor device in accordance with an embodiment.

FIG. 1 is a configuration diagram illustrating a representation of an example of a semiconductor device in accordance with an embodiment.

The semiconductor device in accordance with an embodiment may include a command signal generation block 100, a ZQ control block 200, and a ZQ driving block 300.

The command signal generation block 100 may generate a calibration start signal CAL_S for starting the calibrating operation of a corresponding channel, and may output the calibration start signal CAL_S to the ZQ control block 200. The command signal generation block 100 may generate a calibration latch signal CAL_LATP for latching a calibration signal, and may output the calibration latch signal CAL_LATP to the ZQ driving block 300.

The ZQ control block 200 may receive signals for information on a calibrating operation, from another channel. The signals for information on the calibrating operation of another channel may include a calibration start signal CAL_S_I, a calibration end signal ENDP_I, a calibration period signal CAL_P_I, and an option signal BOND_OPT. The ZQ control block 200 may receive a calibrating operation signal, from another channel. The calibrating operation signal of another channel, may include the calibration start signal CAL_S_I, the calibration end signal ENDP_I, and the calibration period signal CAL_P_I.

The calibration start signal CAL_S_I may be a signal indicating that the calibrating operation of another channel has started. The calibration end signal ENDP_I may be a signal indicating that the calibrating operation of another channel has ended. The calibration period signal CAL_P_I may be a signal indicating the calibration period of another channel. The option signal BOND_OPT may be a signal determining an order for performing a calibrating operation.

The ZQ control block 200 may receive an end signal ENDP from the ZQ driving block 300. The ZQ control block 200 may receive the end signal ENDP indicating that the calibration of the corresponding channel has ended, and the end signal ENDP may be fed back with a calibration period signal CAL_P. The calibration period signal CAL_P may indicate the calibration period of the corresponding channel. The ZQ control block 200 may output a start signal ISTART to the ZQ driving block 300. The start signal ISTART may indicate the start of the calibrating operation of the corresponding channel.

The ZQ driving block 300 may control the calibrating operation according to the calibration latch signal CAL_LATP. The calibration latch signal CAL_LATP may be applied from the command signal generation block 100. The ZQ driving block 300 may start the calibrating operation according to the start signal ISTART, and may perform the calibrating operation in correspondence to the calibration period signal CAL_P. The ZQ driving block 300 may enable the end signal ENDP when the calibrating operation has ended, and may output the enabled end signal ENDP to the ZQ control block 200.

Figure 2:
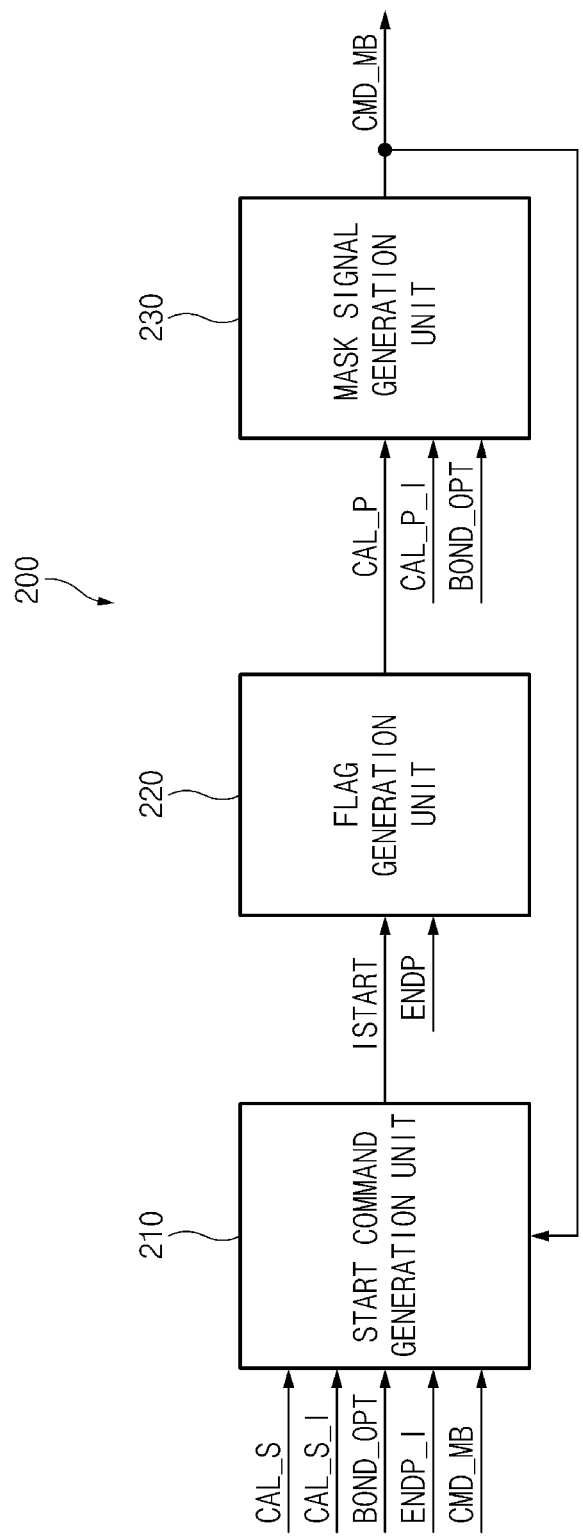
FIG. 2 is a detailed configuration diagram illustrating a representation of an example of the ZQ control block illustrated in FIG. 1.

FIG. 2 is a detailed configuration diagram illustrating a representation of an example of the ZQ control block 200 illustrated in FIG. 1.

The ZQ control block 200 may include a start command generation unit 210, a flag generation unit 220, and a mask signal generation unit 230.

The start command generation unit 210 may receive the calibration start signal CAL_S of the corresponding channel and the calibration start signal CAL_S_I of another channel, and may generate the start signal ISTART for controlling the starting time of the calibrating operation of the corresponding channel.

Such a start command generation unit 210 receives the calibration start signal CAL_S of the corresponding channel, the calibration start signal CAL_S_I of another channel, the option signal BOND_OPT, the calibration end signal ENDP_I of another channel, and a mask signal CMD_MB. The start command generation unit 210 may output the start signal ISTART to the flag generation unit 220. The start signal may indicate the start of the calibrating operation of the corresponding channel.

The flag generation unit 220 may enable the calibration period signal CAL_P when the start signal ISTART is enabled (i.e., reaches a predetermined level), and may disable the calibration period signal CAL_P when the end signal ENDP is enabled. The enablement of the end signal ENDP may end the calibrating operation.

The flag generation unit 220 may receive the start signal ISTART from the start command generation unit 210, and may receive the end signal ENDP, from the ZQ driving block 300, indicating the end of the calibration of the corresponding channel. The flag generation unit 220 may output the calibration period signal CAL_P to the mask signal generation unit 230 in correspondence with the start signal ISTART and the end signal ENDP.

The mask signal generation unit 230 may receive information on the operation timing of the corresponding channel, according to the option signal BOND_OPT. The mask signal generation unit 230 may generate the mask signal CMD_MB for masking the calibrating operation of the corresponding channel, in correspondence to the calibration period signal CAL_P of the corresponding channel and the calibration period signal CAL_P_I of another channel.

The mask signal generation unit 230 may mask the operation of the corresponding channel in the state in which another channel is operating, in correspondence to the calibration period signal CAL_P_I, and may prevent the corresponding channel from operating, until the operation of another channel has ended.

The mask signal generation unit 230 may receive the calibration period signal CAL_P from the flag generation unit 220. The mask signal generation unit 230 may receive the calibration period signal CAL_P_I indicating the calibration period of another channel, and the option signal BOND_OPT. The mask signal generation unit 230 may generate the mask signal CMD_MB and may output the mask signal CMD_MB. The mask signal generation unit 230 may output the mask signal CMD_MB to the start command generation unit 210.

Figure 3:
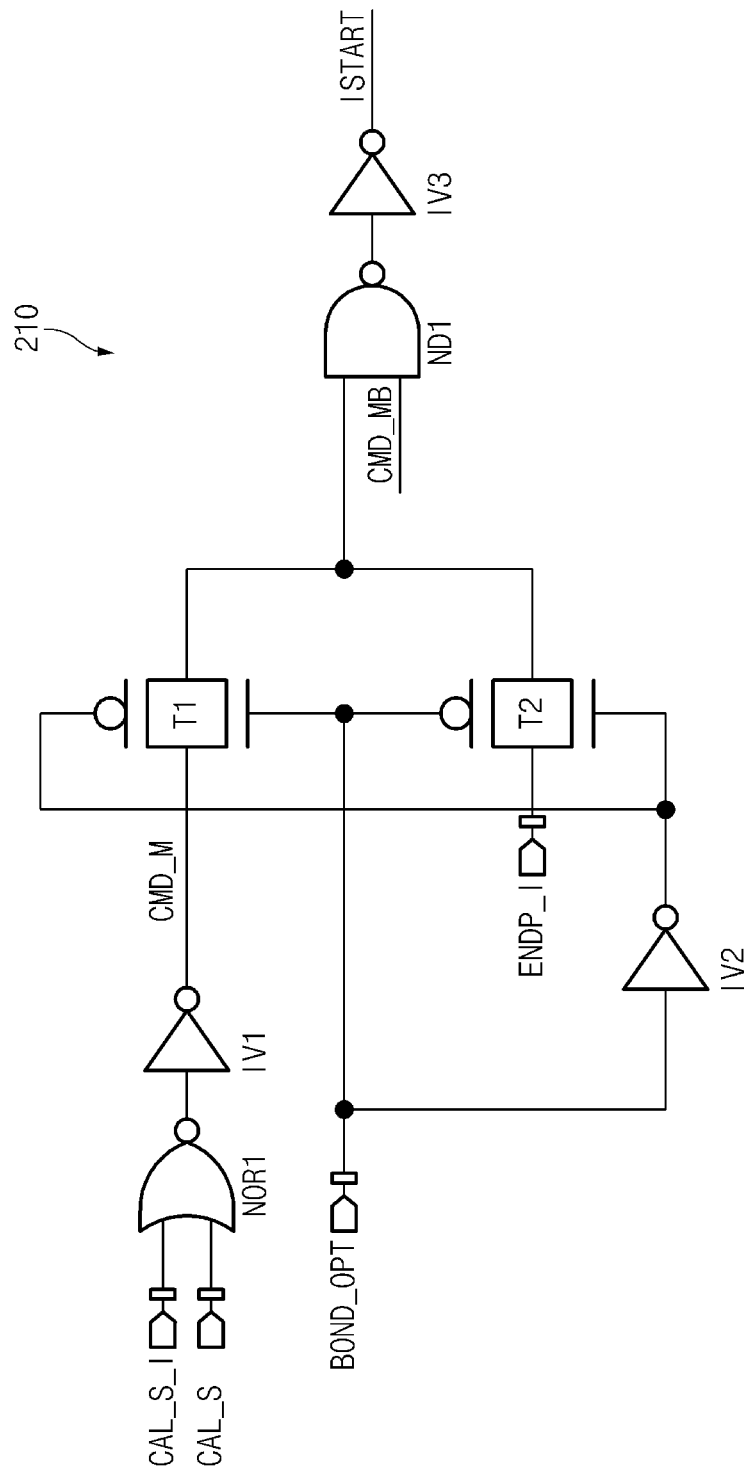
FIG. 3 is a detailed circuit diagram illustrating a representation of an example of the start command generation unit illustrated in FIG. 2.

FIG. 3 is a detailed circuit diagram illustrating a representation of an example of the start command generation unit 210 illustrated in FIG. 2.

The start command generation unit 210 may perform a logic operation. The start command generation unit 210 may include at least one logic gate, for example, a NOR gate NOR1, a plurality of inverters IV1 to IV3, a plurality of transmission gates T1 and T2, and a NAND gate ND1.

The NOR gate NOR1 NORs or performs a NOR logic function on the calibration start signal CAL_S and the calibration start signal CAL_S_I. The inverter IV1 inverts the output of the NOR gate NOR1, and outputs a command signal CMD_M.

The transmission gate T1 selectively outputs the command signal CMD_M in correspondence to the option signal BOND_OPT and the inverted signal of the option signal BOND_OPT. The inverted signal of the option signal BOND_OPT is generated as the inverter IV2 inverts the option signal BOND_OPT. The transmission gate T2 selectively outputs the calibration end signal ENDP_I in correspondence to the option signal BOND_OPT and the inverted signal of the option signal BOND_OPT. The inverted signal of the option signal BOND_OPT is generated as the inverter IV2 inverts the option signal BOND_OPT. The transmission gate T1 and the transmission gate T2 operate complementarily.

The NAND gate ND1 NANDs or performs a NAND logic function on the outputs of the transmission gates T1 and T2 and the mask signal CMD_MB. The inverter IV3 inverts the output of the NAND gate ND1 and outputs the start signal ISTART.

The start command generation unit 210 having the above-described configuration may output the command signal CMD_M at, for example, a high level in the example where at least any one of the calibration start signal CAL_S of the corresponding channel and the calibration start signal CAL_S_I of another channel is enabled (i.e., or at a predetermined level).

The example where the option signal BOND_OPT is a high level represents the example where a channel CH_A (see FIG. 6) operates first. Accordingly, if the option signal BOND_OPT is at the high level, the transmission gate T1 is turned on and outputs the command signal CMD_M with the high level to the NAND gate ND1.

The NAND gate ND1 and the inverter IV3 enable the start signal ISTART to a high level in the example where both the command signal CMD_M and the mask signal CMD_MB have high levels. Since the mask signal CMD_MB is a signal which is enabled to a low level, the mask signal CMD_MB retains the state disabled to the high level while a masking operation is not performed.

Conversely, the example where the option signal BOND_OPT is a low level represents the example where a channel CH_B (see FIG. 6) operates first. Accordingly, if the option signal BOND_OPT is at the low level, the transmission gate T2 is turned on and outputs the calibration end signal ENDP_I of another channel to the NAND gate ND1.

The NAND gate ND1 and the inverter IV3 enable the start signal ISTART to the high level only in the example where both the calibration end signal ENDP_I and the mask signal CMD_MB have high levels.

In the example where the calibration end signal ENDP_I has a low level, since it is meant that the calibrating operation is performed in another channel, the start signal ISTART retains a disabled state. If the calibrating operation of another channel is ended, the calibration end signal ENDP_I transitions to the high level and the start signal ISTART is enabled to the high level.

In the example where the mask signal CMD_MB is enabled to the low level, the start signal ISTART is disabled to a low level. Accordingly, the start command generation unit 210 masks the start signal ISTART until the calibration end signal ENDP_I of another channel performing calibration is enabled.

Figure 4:
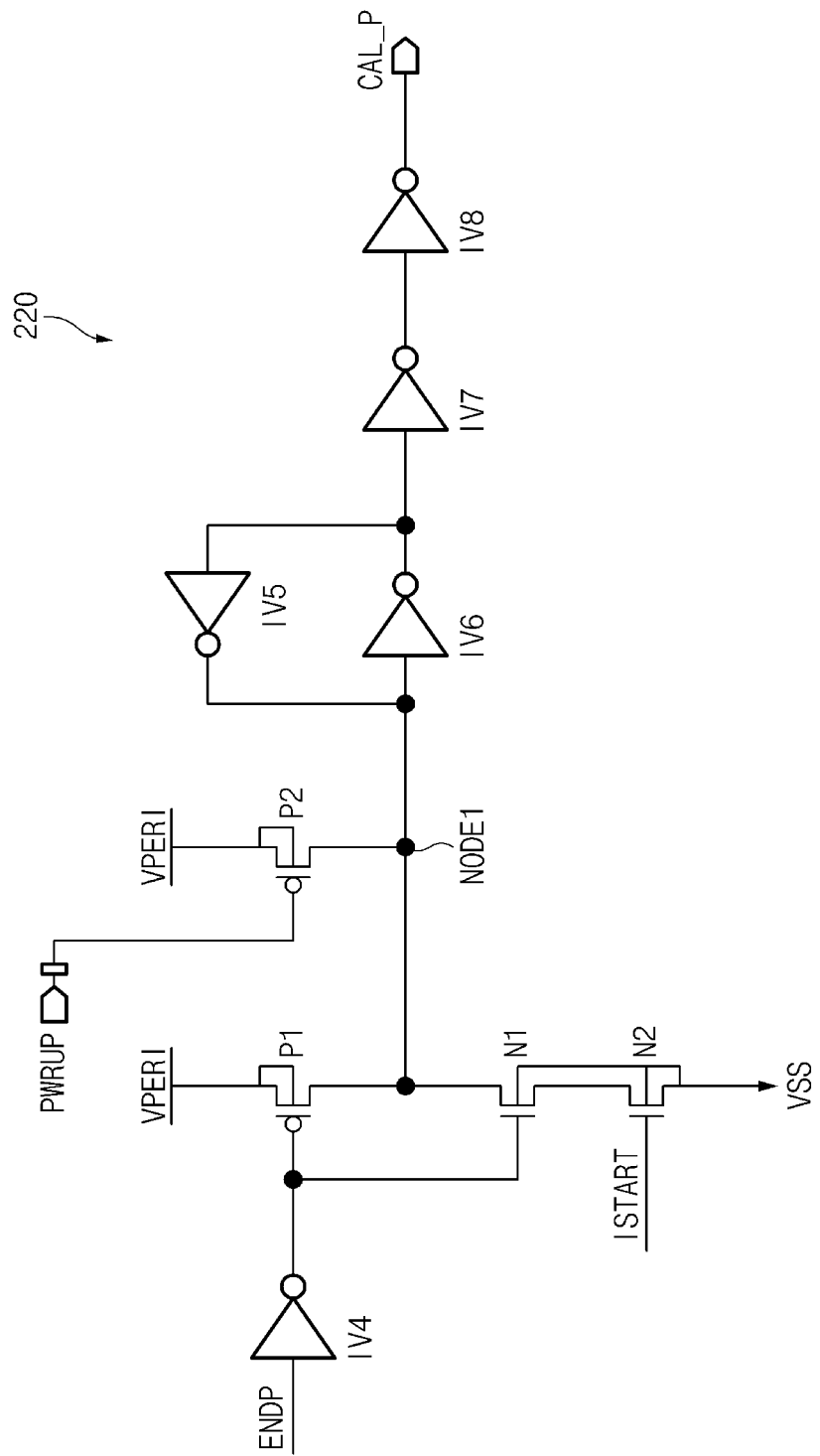
FIG. 4 is a detailed circuit diagram illustrating a representation of an example of the flag generation unit illustrated in FIG. 2.

FIG. 4 is a detailed circuit diagram illustrating a representation of an example of the flag generation unit 220 illustrated in FIG. 2.

The flag generation unit 220 may include a plurality of inverters IV4 to IV8, a plurality of PMOS transistors P1 and P2, and a plurality of NMOS transistors N1 and N2.

The PMOS transistor P1 and the NMOS transistors N1 and N2 are electrically coupled in series between the application terminal of a peripheral voltage VPERI and the application terminal of a ground voltage VSS. The PMOS transistor P1 and the NMOS transistor N1 are applied with the inverted signal of the end signal ENDP. The end signal ENDP is generated as the inverter IV4 inverts the end signal ENDP. The PMOS transistor P1 and the NMOS transistor N1 are applied with the inverted signal of the end signal ENDP through a common gate terminal. The NMOS transistor N2 is applied with the start signal ISTART through the gate terminal thereof.

The PMOS transistor P2 is electrically coupled between the application terminal of the peripheral voltage VPERI and a node NODE'. The PMOS transistor P2 is applied with a power-up signal PWRUP through the gate terminal thereof. The inverters IV5 and IV6 are electrically coupled in a latch structure, and latch the output of the node NODE1 for a predetermined time. The inverters IV7 and IV8 non-invertingly delay the output of the inverter IV6, and output the calibration period signal CAL_P.

In the flag generation unit 220 having the above-described configuration, the PMOS transistor P1 is turned on in the example where the end signal ENDP which indicates the ending of the calibrating operation of the corresponding channel has a high level. Accordingly, the node NODE1 becomes the level of the peripheral voltage VPERI, and the output of the node NODE1 is latched by the latches IV5 and IV6 for the predetermined time. The calibration period signal CAL_P is outputted to a low level by the inverters IV7 and IV8.

If the calibrating operation of the corresponding channel is ended, the flag generation unit 220 disables the calibration period signal CAL_P to the low level and outputs the disabled calibration period signal CAL_P.

In the flag generation unit 220, the NMOS transistor N1 is turned on in the example where the end signal ENDP which indicates the ending of the calibrating operation of the corresponding channel is a low level. At this time, in the example where the start signal ISTART is at the high level, the NMOS transistor N2 is also turned on.

The node NODE1 becomes a low voltage level, and the output of the node NODE1 is latched by the latches IV5 and IV6 for the predetermined time. The calibration period signal CAL_P is outputted to a high level by the inverters IV7 and IV8.

If the calibrating operation of the corresponding channel is not ended and is being performed, the flag generation unit 220 enables the calibration period signal CAL_P to the high level and outputs the enabled calibration period signal CAL_P. If the start signal ISTART is enabled, the flag generation unit 220 enables the calibration period signal CAL_P and outputs the enabled calibration period signal CAL_P until the end signal ENDP of the corresponding channel is enabled (i.e., or is at a predetermined level).

If the power-up signal PWRUP transitions to a low level, the PMOS transistor P2 is turned on, and the node NODE1 retains the level of the peripheral voltage VPERI. Then, the calibration period signal CAL_P retains the low level.

Figure 5:
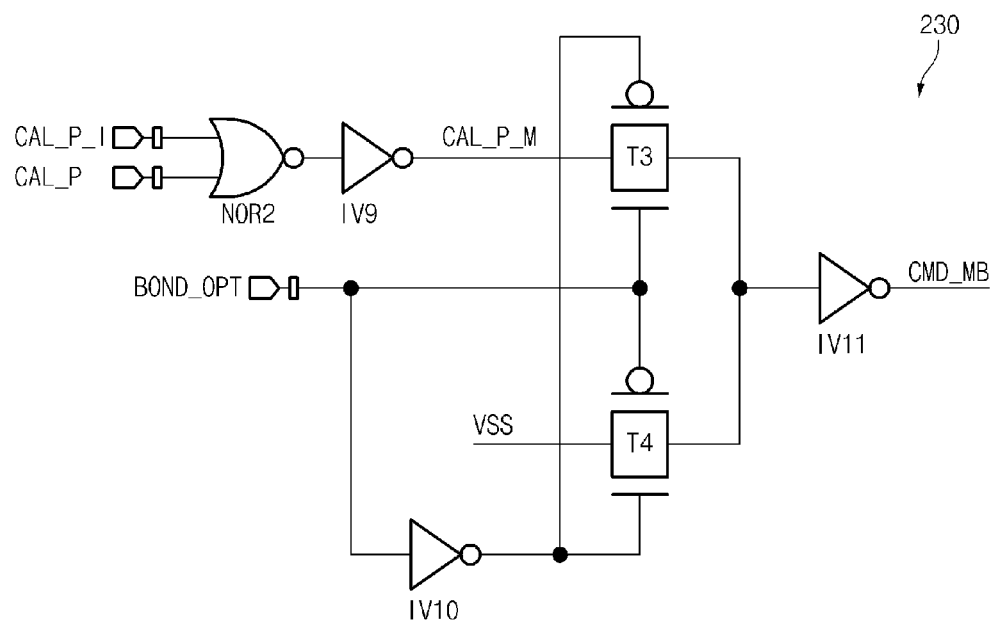
FIG. 5 is a detailed circuit diagram illustrating a representation of an example of the mask signal generation unit illustrated in FIG. 2.

FIG. 5 is a detailed circuit diagram illustrating a representation of an example of the mask signal generation unit 230 illustrated in FIG. 2.

The mask signal generation unit 230 may include a NOR gate NOR2, a plurality of inverters IV9 to IV11, and a plurality of transmission gates T3 and T4.

The NOR gate NOR2 NORs or performs a NOR logic function on the calibration period signal CAL_P_I and the calibration period signal CAL_P. The inverter IV9 inverts the output of the NOR gate NOR2, and outputs a period signal CAL_P_M.

The transmission gate T3 selectively outputs the period signal CAL_P_M in correspondence to the option signal BOND_OPT and the inverted signal of the option signal BOND_OPT. The inverted signal of the option signal BOND_OPT is generated as the inverter IV10 inverts the option signal BOND_OPT. The transmission gate T4 selectively outputs the ground voltage VSS in correspondence to the option signal BOND_OPT and the inverted signal of the option signal BOND_OPT. The inverted signal of the option signal BOND_OPT is generated as the inverter IV10 inverts the option signal BOND_OPT.

The transmission gate T3 and the transmission gate T4 operate complementarily. The inverter IV11 inverts the outputs of the transmission gates T3 and T4, and outputs the mask signal CMD_MB.

The mask signal generation unit 230 having the above-described configuration outputs the period signal CAL_P_M at, for example, a high level in the example where at least any one of the calibration period signal CAL_P_I of another channel and the calibration period signal CAL_P of the corresponding channel is enabled (i.e., at a predetermined level).

The example where the calibration period signal CAL_P is at the high level represents the example where the channel CH_A (see FIG. 6) is operating. The example where the calibration period signal CAL_P_I is a high level represents the example where the channel CH_B (see FIG. 6) is operating.

Accordingly, if the option signal BOND_OPT is at the high level, the transmission gate T3 is turned on and outputs the period signal CAL_P_M with the high level to the inverter IV11. The inverter IV11 inverts the period signal CAL_P_M, and enables the mask signal CMD_MB to the low level and outputs the enabled mask signal CMD_MB. Due to this fact, in the state in which the mask signal CMD_MB is enabled, masking is implemented such that other command signals are not inputted while the channel CH_A operates.

The example where the option signal BOND_OPT is at the low level represents the example where the channel CH_B (see FIG. 6) operates first. Accordingly, if the option signal BOND_OPT is at the low level, the transmission gate T4 is turned on and outputs the ground voltage VSS to the inverter IV11. Then, the inverter IV11 disables the mask signal CMD_MB to the high level and outputs the disabled mask signal CMD_MB.

It was described as an example in the embodiments that the channel CH_A operates earlier than the channel CH_B. Therefore, in the example where the option signal BOND_OPT has the high level, the calibration period signal CAL_P_I and the calibration period signal CAL_P are logically combined through the NOR gate NOR2. Due to this fact, only in the example of the corresponding channel which is operating, the start signal ISTART is masked according to the mask signal CMD_MB.

Figure 6:
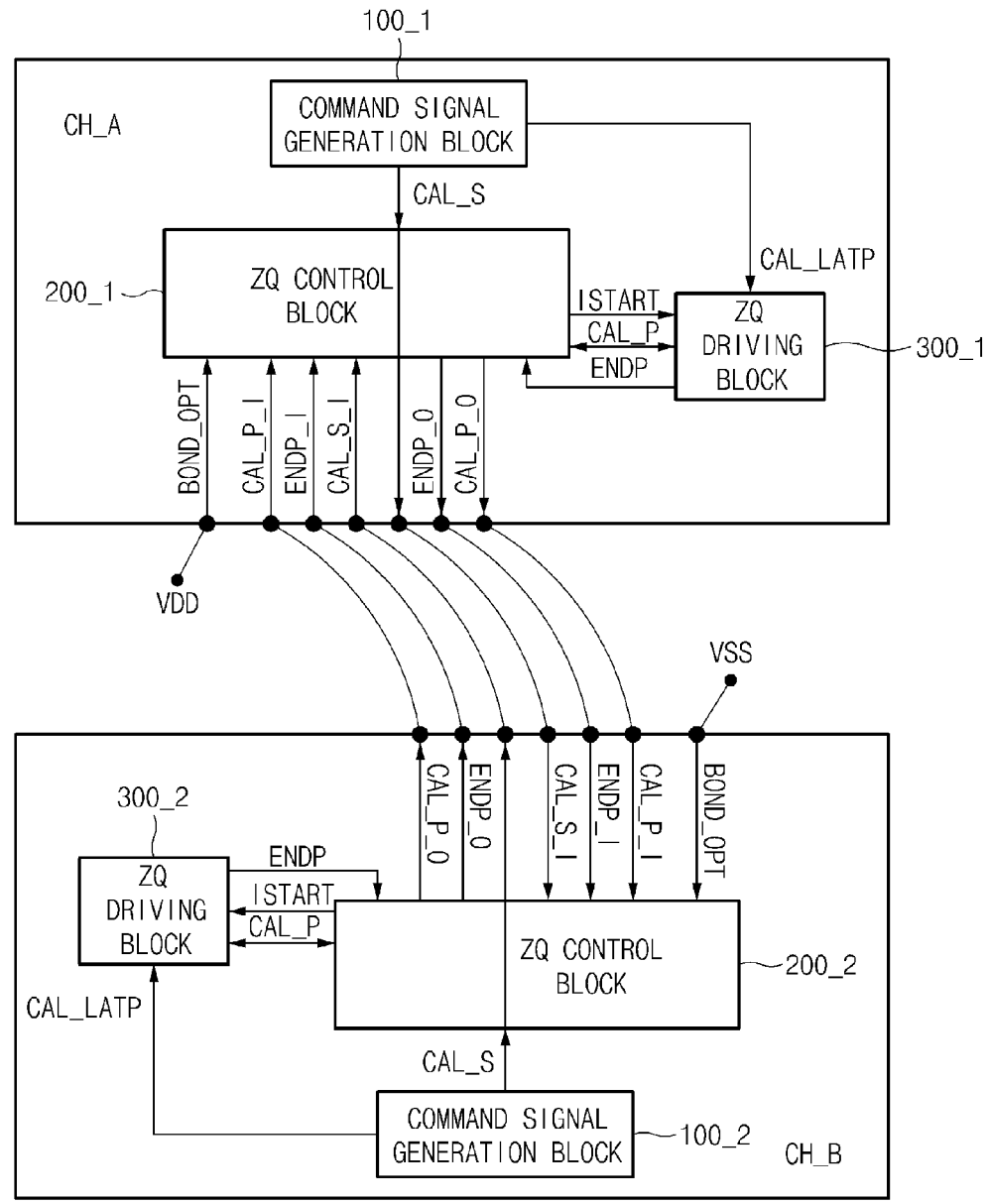
FIG. 6 is a configuration diagram illustrating a representation of an example of 2 channels in a semiconductor device in accordance with an embodiment.

FIG. 6 is a configuration diagram illustrating a representation of an example of 2 channels in a semiconductor device in accordance with an embodiment.

In an embodiment, two channels CH_A and CH_B may be configured as one chip. The two channels CH_A and CH_B may be disposed in separate dies. To process a ZQ calibration command inputted to the respective channels CH_A and CH_B, ZQ-related signals are electrically coupled with each other through bonding between the dies separately disposed in a package.

A command signal generation block 100_1 of the channel CH_A may output a calibration start signal CAL_S to a ZQ control block 200_1, and thereby enables the calibrating operation of the channel CH_A. The command signal generation block 100_1 may output a calibration start signal CAL_S_I to another channel CH_B through bonding with a bonding pad.

A command signal generation block 100_2 of the channel CH_B may output a calibration start signal CAL_S to a ZQ control block 200_2, and thereby enables the calibrating operation of the channel CH_B. The command signal generation block 100_2 may output a calibration start signal CAL_S_I to another channel CH_A through bonding with a bonding pad.

In an embodiment, the two channels CH_A and CH_B start the calibrating operation by the calibration start signal CAL_S, and share calibrating operation start information with each other.

In an embodiment, the two channels CH_A and CH_B sequentially start the calibrating operation. Any one channel of the two channels CH_A and CH_B, for example, the channel CH_A starts may begin the calibration operation first or before the other channel, for example channel CH_B.

In an embodiment, instead of having channel CH_A operate first, channel CH_B may first perform the calibrating operation. The embodiments are not limited to such examples. E-fuses (electrical fuses) may be used in determining the priorities of respective channels.

The ZQ control block 200_1 of the channel CH_A may receive an option signal BOND_OPT with the level of a power supply voltage VDD indicating a bonding option, from an exterior. The ZQ control block 200_2 of the channel CH_B receives an option signal BOND_OPT with the level of a ground voltage VSS indicating a bonding option, from an exterior.

The two channels CH_A and CH_B may be determined in order for performing the calibrating operation, according to the bonding options. For example, the channel CH_A in which the option signal BOND_OPT has the level of the power supply voltage VDD may be set to operate first, and the channel CH_B in which the option signal BOND_OPT has the level of the ground voltage VSS may be set to operate next. The embodiments are not limited to such examples, and it is to be noted that the channel CH_B may be set to operate first.

In an embodiment, the channel CH_A and the channel CH_B may be dies manufactured at substantially or at the same. The channel CH_A and the channel CH_B may be realized by mirroring two dies in packaging, and, since channel CH_A and the channel CH_B may be the same dies, they may be classified in terms of function, according to bonding options.

The command signal generation block 100_1 may generate a calibration latch signal CAL_LATP, and may output the calibration latch signal CAL_LATP to a ZQ driving block 300_1. The ZQ control block 200_1 receives an end signal ENDP indicating the end of the calibration of the channel CH_A. The ZQ control block 200_1 receives a calibration period signal CAL_P, from the ZQ driving block 300_1, and outputs a start signal ISTART indicating the start of the calibrating operation of the channel CH_A, to the ZQ driving block 300_1.

The ZQ control block 200_1 receives the calibration start signal CAL_S_I, a calibration end signal ENDP_I and a calibration period signal CAL_P_I, from the channel CH_B. The ZQ control block 200_1 outputs an end signal ENDP_O indicating the end of the calibration of the channel CH_A, and a calibration period signal CAL_P_O, to the channel CH_B through the bonding of the bonding pads.

The command signal generation block 100_2 may generate a calibration latch signal CAL_LATP, and may output the calibration latch signal CAL_LATP to a ZQ driving block 300_2. The ZQ control block 200_2 receives an end signal ENDP indicating the end of the calibration of the channel CH_B. The ZQ control block 200_2 receives a calibration period signal CAL_P, from the ZQ driving block 300_2, and outputs a start signal ISTART indicating the start of the calibrating operation of the channel CH_B, to the ZQ driving block 300_2.

The ZQ control block 200_2 receives the calibration start signal CAL_S_I, a calibration end signal ENDP_I and a calibration period signal CAL_P_I, from the channel CH_A. The ZQ control block 200_2 outputs an end signal ENDP_O indicating the end of the calibration of the channel CH_B, and a calibration period signal CAL_P_O, to the channel CH_A through the bonding of the bonding pads.

In an embodiment, the respective channels CH_A and CH_B operate by the separate ZQ driving blocks 300_1 and 300_2. The channel CH_A performs the calibrating operation with the ZQ driving block 300_1, and the channel CH_B performs the calibrating operation with the ZQ driving block 300_2.

In the respective channels CH_A and CH_B, the suffix "_I" means a signal inputted from another channel to the corresponding channel, and the suffix "_O" means a signal outputted from the corresponding channel to another channel.

In an embodiment, a ZQ pin may include only one pad electrically coupled to an exterior of a chip. If 2 channels are configured by packaging 2 dies, the 2 dies have different process distributions. Since there is one external ZQ resistor, a technology for independently calibrating two dies and ensuring that the calibration periods of the two dies do not overlap with each other is needed.

A method has been suggested in which a ZQ pad is bonded in one die and the calibration result of a channel (for example, the channel CH_A) which is bonded is updated to a channel (for example, the channel CH_B) which is not bonded, as it is. However, since the two channels CH_A and CH_B are separate dies, in the example where the difference in distribution between the two dies is substantial, the precision of a calibration result may deteriorate markedly.

Both the 2 channels CH_A and CH_B may be bonded with external ZQ pads and may share a ZQ calibration start command. Calibrating operations may be respectively performed by using the ZQ driving blocks respectively disposed in two dies, and the two dies may be caused to operate according to the start signal applied from one channel.

While the precision of the calibration may be retained, in the example where a ZQ latch command overlaps with the calibration period of a channel which does not generate the start signal, a calibration result may not be updated.

In an embodiment, both the 2 channels CH_A and CH_B are bonded with external ZQ pads. Further, the 2 channels CH_A and CH_B receive and output information on calibration start commands, calibration end commands and calibration periods, from and to each other. In this example, calibrating operation periods do not overlap with each other in the 2 channels CH_A and CH_B.

In other words, only when the operation of the channel CH_A which has first started to operate has ended, is the calibration of the channel CH_B started. Further, until the operation of the channel CH_B is ended, the input of an external command to the channel CH_A is masked such that the operation of the channel CH_A is not started. Thus, it may be possible to prevent the occurrence of a situation in which ZQ operations in the two channels CH_A and CH_B overlap with each other.

It was described as an example in an embodiment that the two channels CH_A and CH_B are configured as one chip. However, it is to be noted that the embodiments are not limited to such an example and a plurality of channels more than 2 may be used to configure one chip.

Figure 7:
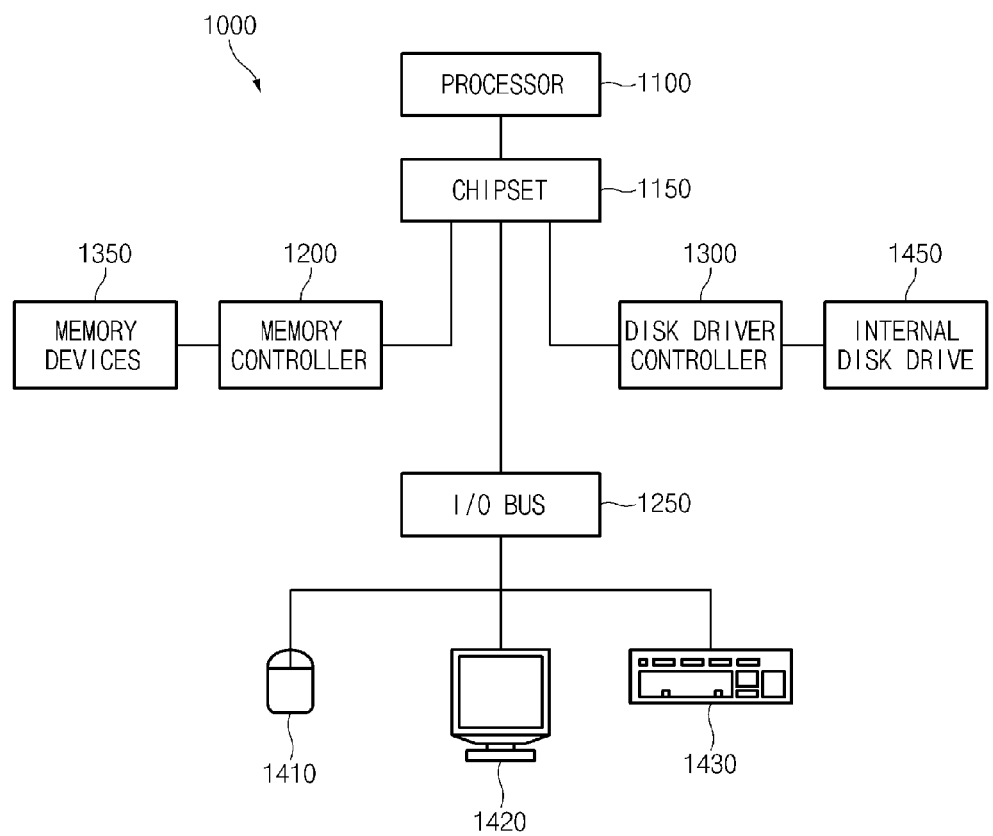
FIG. 7 illustrates a block diagram of an example of a representation of a system employing the semiconductor device in accordance with the embodiments discussed above with relation to FIGS. 1-6.

The semiconductor device discussed above (see FIGS. 1-6) are particular useful in the design of memory devices, processors, and computer systems. For example, referring to FIG. 7, a block diagram of a system employing the semiconductor device in accordance with the embodiments are illustrated and generally designated by a reference numeral 1000. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented.

A chipset 1150 may be operably coupled to the CPU 1100. The chipset 1150 is a communication pathway for signals between the CPU 1100 and other components of the system 1000, which may include a memory controller 1200, an input/output ("I/O") bus 1250, and a disk drive controller 1300. Depending on the configuration of the system, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be operably coupled to the chipset 1150. The memory controller 1200 may include at least one semiconductor device as discussed above with reference to FIGS. 1-6. Thus, the memory controller 1200 can receive a request provided from the CPU 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor device as discussed above with relation to FIGS. 1-6, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 (i.e., internal disk drive) may also be operably coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

It is important to note that the system 1000 described above in relation to FIG. 7 is merely one example of a system employing the semiconductor device as discussed above with relation to FIGS. 1-6. In alternate embodiments, such as cellular phones or digital cameras, the components may differ from the embodiments illustrated in FIG. 7.

While various embodiments have been described above, it will be understood to those skilled in the art that the embodiments described are by way of example only. Accordingly, the semiconductor device described herein should not be limited based on the described embodiments.

What is claimed is:

1. A semiconductor device comprising:
a first channel provided in a first die; and
a second channel provided in a second die and disposed adjacent to the first channel, and configured to exchange signals and data with the first channel; and
a ZQ control block configured to receive calibration start signals, a calibrating operation signal of another channel, a calibrating operation signal and an option signal, and output a start signal for driving a calibrating operation and a calibration period signal,
wherein the first channel and the second channel receive and output calibration-related signals from and to each other through bonding, and share the calibration start signals, and
wherein the calibration start signals are respectively generated in the first channel and the second channel, and
wherein the ZQ control block includes a mask signal generation unit configured to receive the calibration period signal, the calibration period signal of another channel and the option signal, and generate the mask signal.

2. The semiconductor device according to claim 1, wherein the first channel comprises a first ZQ driving block configured to control a calibrating operation according to a calibration latch signal.

3. The semiconductor device according to claim 1, wherein the second channel comprises a second ZQ driving block configured to control a calibrating operation according to a calibration latch signal.

4. The semiconductor device according to claim 1, wherein the first channel and the second channel sequentially operate.

5. The semiconductor device according to claim 1, wherein an order of operation of the first channel and the second channel are determined according to bonding options.

6. The semiconductor device according to claim 5, wherein the first channel receives an option signal including a power supply voltage level.

7. The semiconductor device according to claim 5, wherein the second channel receives an option signal including a ground voltage level.

8. The semiconductor device according to claim 1,
wherein the first channel receives and outputs at least any one signal of a calibration start signal, a calibration end signal and a calibration period signal, from and to the second channel, and
wherein the second channel receives and outputs at least any one signal of the calibration start signal, the calibration end signal and the calibration period signal, from and to the first channel.

9. The semiconductor device according to claim 1, wherein the calibration start signal of the first channel is masked until the calibration end signal of the second channel reaches a predetermined level.

10. The semiconductor device according to claim 1, wherein each of the first channel and the second channel comprises:
a command signal generation block configured to generate a calibration start signal and a calibration latch signal; and
a ZQ driving block configured to perform the calibrating operation in correspondence to the start signal, and output a calibration end signal to the ZQ control block.

11. The semiconductor device according to claim 10, wherein the calibrating operation signal of another channel comprises a calibration start signal, a calibration end signal and a calibration period signal.

12. The semiconductor device according to claim 10, wherein the ZQ control block comprises:
a start command generation unit configured to output the start signal in correspondence to the calibration start signal, the calibration start signal of another channel, the option signal, the calibration end signal of another channel, and a mask signal; and
a flag generation unit configured to output the calibration period signal in correspondence to the start signal and an end signal.

13. The semiconductor device according to claim 12,
wherein the mask signal generation unit enables the mask signal when at least any one of the calibration period signal and the calibration period signal of another channel is at a predetermined level when the option signal has a first level, and
wherein the mask signal generation unit disables the mask signal when the option signal has a second level.

14. The semiconductor device according to claim 12,
wherein the start command generation unit enables the start signal when at least any one of the calibration start signal and the calibration start signal of another channel is at a predetermined level when the optional signal has a first level, and
wherein the start command generation unit outputs the start signal in correspondence to the calibration end signal of another channel when the option signal has a second level.

15. The semiconductor device according to claim 12, wherein the flag generation unit disables the calibration period signal when the end signal is at a predetermined level, and enables the calibration period signal when the end signal is at another predetermined level.

16. A semiconductor device comprising:
a plurality of channels formed in a single package, and configured to share calibration information through exchanging signals and data among respective dies;

ZQ driving blocks respectively provided in the plurality of channels, and configured to control calibrating operations of the respective channels ZQ control blocks configured to determine starting orders of the calibrating operations in the plurality of channels, and when the calibrating operations are ended in the respective channels; and a mask signal generation unit configured to receive a calibration period signal, a calibration period signal of another channel and an option signal, and generate the mask signal.

17. The semiconductor device according to claim 16, further comprising:

command signal generation blocks respectively provided in the plurality of channels, and configured to generate calibration start signals of corresponding channels.

18. The semiconductor device according to claim 16, wherein each of the ZQ control blocks comprises:

a start command generation unit configured to output a start signal in correspondence to a calibration start signal, a calibration start signal of another channel, the option signal, a calibration end signal of another channel, and a mask signal; and a flag generation unit configured to output the calibration period signal in correspondence to the start signal and an end signal.

19. The semiconductor device according to claim 16, wherein an order of operation of the plurality of channels are determined according to bonding options, and wherein the plurality of channels operate sequentially.

20. A semiconductor device comprising:

a first channel provided in a first die; and a second channel provided in a second die, and configured to exchange signals and data with the first channel; and a ZQ control block configured to receive a calibration period signal of another channel and an option signal, and output a start signal for driving a calibrating operation and a calibration period signal, wherein the first channel and the second channel receive and output calibration-related signals from and to each other through bonding, and wherein the calibration start signals are respectively generated in the first channel and the second channel, and wherein the ZQ control block includes a mask signal generation unit configured to receive the calibration period signal, the calibration period signal of another channel and the option signal, and generate the mask signal.

* * * * *